(12) United States Patent
Jeon et al.

(10) Patent No.: US 6,919,640 B2
(45) Date of Patent: Jul. 19, 2005

(54) SEMICONDUCTOR DEVICE HAVING A CONTACT WINDOW INCLUDING A LOWER REGION WITH A WIDER WIDTH TO PROVIDE A LOWER CONTACT RESISTANCE

(75) Inventors: Jeong-Sic Jeon, Kyunggi-do (KR); Jae-Woong Kim, Kyunggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/823,485

(22) Filed: Apr. 12, 2004

(65) Prior Publication Data

US 2004/0195698 A1 Oct. 7, 2004

Related U.S. Application Data

(62) Division of application No. 10/341,766, filed on Jan. 13, 2003, now Pat. No. 6,764,955, which is a division of application No. 09/948,425, filed on Sep. 7, 2001, now abandoned.

(30) Foreign Application Priority Data

Oct. 30, 2000 (KR) ........................................ 2000-64054

(51) Int. Cl.$^7$ ............................................ H01L 23/522
(52) U.S. Cl. ........................................ 257/775; 438/640
(58) Field of Search ............................. 257/774, 775; 438/638, 639, 640, 739

(56) References Cited

U.S. PATENT DOCUMENTS

| 4,372,034 | A |   | 2/1983  | Bohr                      |
|-----------|---|---|---------|---------------------------|
| 4,484,979 | A |   | 11/1984 | Stocker                   |
| 5,616,960 | A | * | 4/1997  | Noda et al. ....... 257/760 |
| 5,849,635 | A |   | 12/1998 | Akram et al.              |
| 5,874,357 | A | * | 2/1999  | Jun et al. ......... 438/638 |
| 5,874,358 | A |   | 2/1999  | Myers et al.              |
| 5,880,019 | A |   | 3/1999  | Hsieh et al.              |
| 6,011,311 | A | * | 1/2000  | Hsing et al. ....... 257/774 |
| 6,127,276 | A |   | 10/2000 | Lin et al.                |
| 6,232,225 | B1 | * | 5/2001 | Pong et al. ........ 438/640 |
| 6,355,567 | B1 |   | 3/2002 | Halle et al.              |
| 6,373,123 | B1 |   | 4/2002 | Clampitt                  |
| 6,514,805 | B2 |   | 2/2003 | Xu et al.                 |
| 6,653,739 | B2 | * | 11/2003 | Terauchi et al. .... 257/774 |
| 6,740,584 | B2 | * | 5/2004 | Eimori ............. 438/638 |

FOREIGN PATENT DOCUMENTS

| JP | 4-274321      |   | 9/1992  |                  |
|----|---------------|---|---------|------------------|
| JP | 10270555 A    | * | 10/1998 | ......... H01L/21/768 |
| KR | 1999-0046930  |   | 7/1999  |                  |

OTHER PUBLICATIONS

"Novel Selective EPI Base for Double Poly Structures," IBM Technical Disclosure Bulletin, vol. 35, No. 2, pp. 51–53, Jul. 1992.*

English language abstract of Korean Publication No. 1999–0046930, Jul. 1999.

* cited by examiner

Primary Examiner—Stephen W. Smoot
(74) Attorney, Agent, or Firm—Marger Johnson & McCollom, P.C.

(57) ABSTRACT

Semiconductor devices having a contact window and fabrication methods thereof are provided. A lower dielectric layer, conductive patterns and an upper dielectric layer are formed sequentially on a semiconductor substrate. The lower dielectric layer has a higher isotropic etch rate than that of the upper dielectric layer. The upper dielectric layer and the lower dielectric layer are patterned by anisotropic etching to form a trench without exposing the semiconductor substrate. The resultant structure is subject to isotropic etching to expose the substrate and to form a contact window having a wider width in a lower region than in an upper region without damaging the semiconductor substrate.

8 Claims, 10 Drawing Sheets

SEMICONDUCTOR DEVICE HAVING A CONTACT WINDOW INCLUDING A LOWER REGION WITH A WIDER WIDTH TO PROVIDE A LOWER CONTACT RESISTANCE

This application is a divisional of U.S. Pat. No. 6,764,955 filed Jan. 13, 2003, both of which claim priority from U.S. patent application Ser. No. 09/948,425 filed Sep. 7, 2001, now abandoned, which are herein incorporated by reference in its entirety.

BACKGROUND OF THE INVENTION

1. Field of the Invention

The present invention relates to semiconductor devices and fabrication methods thereof and, more particularly, to semiconductor devices having a contact window providing low contact resistance and high reliability and fabrication methods thereof.

2. Description of the Related Art

Multilevel interconnection in a semiconductor device is important for achieving higher device density and performance. Especially, structures of contact windows and fabrication method for forming the contact windows are essential for forming the multilevel interconnection. The contact windows electrically connect a wiring layer to a semiconductor substrate or connect a wiring layer to another wiring layer. With increased device density, a depth of the contact window tends to be deeper and its width tends to be narrower. The narrow width of the contact window leads to problems such as a small contact area and, as a result, high contact resistance.

With increased device density, a space between conductive patterns also tends to be closer and closer. This tendency makes the width of the contact window more decreased. This is because the contact window is generally formed to pass through a dielectric material between the conductive patterns. This will be further described below with reference to drawings.

FIGS. 1 to 4 are cross sectional views illustrating a process for forming a contact window in a semiconductor device in accordance with a Korean Patent Laid-open Publication No.99-46930.

Referring to FIGS. 1 and 2, a lower dielectric layer 5, conductive patterns 7 and an upper dielectric layer 9 are formed in sequence on a semiconductor substrate 1 having an impurity active region 3. The impurity active region 3 has a predetermined width 13. The lower dielectric layer 5 has a higher wet etch rate than a wet etch rate of the upper dielectric layer 9 for a selected oxide etching solution such as hydrofluoric acid (HF) solution. The lower dielectric layer 5 is formed of a borophosphosilicate glass (BPSG) layer or a spin-on-glass (SOG) layer. The upper dielectric layer 9 is formed of an undoped silicate glass (USG) layer or a high density plasma (HDP) oxide layer. On the upper dielectric layer 9, a photoresist pattern 11 having an opening is formed to define a contact window area. The upper dielectric layer 9 and the lower dielectric layer 5 are partially removed by a dry etching process using the photoresist pattern 11 as an etch mask. As a result, a contact window 19 is formed to expose the impurity active region 3. At this time, the conductive patterns 7 should not be exposed by the contact window 19 as shown in FIG. 2. Therefore, the width 21 of the contact window 19 should be narrower than the spacing 15 between the conductive patterns 7.

The exposed surface 22 of the impurity active region 3 is severely damaged due to the dry etching process during formation of the contact window 19. Accordingly, the etching damage may increase contact resistance and junction leakage current.

Referring to FIG. 3, the resultant structure is dipped into the selected oxide etching solution to form a final contact window 19'. With this wet etching, the upper dielectric layer 9 is etched to a lesser extent of a selected width 20 in a lateral direction; the lower dielectric layer 5 is etched to greater extent in the lateral direction. Consequently, the final contact window 19' has a wider width 21' in a lower region than the width in an upper region. Therefore, an exposed surface area of the impurity active region 3 is increased by the wet etching, as compared with an exposed surface area formed immediately after the dry etching. Referring to FIG. 4, the photoresist pattern 11 is removed. Then, a wiring material 24 is formed on the resultant structure to fill the contact window 19'.

In the prior art, the dry etching exposes the semiconductor substrate 1. If the dry etching is overdone, it may cause a surface damage 22 (See FIG. 2) of the impurity active region 3. Therefore, the dry etching should be controlled with high accuracy to prevent the damage. This dry etching damage causes serious problems such as high contact resistance and high junction leakage current in a semiconductor device.

The contact window 19 should not expose the conductive patterns 7 to insure electrical isolation therebetween. Therefore, a width 17 of the opening of the photoresist pattern 11 and a width 21 of the contact window 19 should not be increased greater than a distance 15 between the conductive patterns 7. In other words, the shorter the spacing between the conductive patterns 7 is, the narrower the width of the contact window 19 is, as described above.

The wet etching also should be controlled with high accuracy, because a distance 26 between the wiring material 24 and the conductive patterns 7 needs to be properly maintained. Assume that the wet etching is overdone and the lower dielectric layer 5 is excessively etched in the lateral direction, and, as a result, the contact window 19' exposes a bottom side of the conductive patterns 7. This can result in an undesirable electrical connection between the wiring material 24 and the conductive patterns 7. Therefore, in the prior art, the width 21' in a lower region of the final contact window 19' cannot be greater than the spacing between the conductive patterns 7. Thus, a contact area between the wiring layer and the conductive patterns 7 is limited by the spacing between the conductive patterns 7. Accordingly, it is difficult to reduce contact resistance.

According to the prior art, the dry and the wet etching should be performed very carefully. That is to say, it is very difficult to maintain the high accuracy necessary to avoid above-mentioned problems during the dry and wet etching.

SUMMARY OF THE INVENTION

It is, therefore, an object of the present invention to provide a method for forming a contact window without dry etching damage in a semiconductor substrate. Another object of the present invention is to provide a method for forming a contact window that maximizes a contact area and improves electrical isolation characteristic with neighboring conductive patterns simultaneously.

Another object of the present invention is to provide a structure for a contact window that improves the contact resistance and junction leakage current characteristics as well as the electrical isolation characteristic with neighboring conductive patterns.

According to one aspect of the invention, a method of forming a contact window is provided. This method comprises forming a lower dielectric layer and an upper dielectric layer in sequence on a semiconductor substrate. The lower dielectric layer has a higher isotropic etch rate than an isotropic etch rate of the upper dielectric layer for a selected isotropic etching condition. The upper dielectric layer and the lower dielectric layer are etched by an anisotropic etching to form a trench not exposing the semiconductor substrate.

Thus, it is possible to prevent the semiconductor substrate from being damaged by the anisotropic etching. A sidewall of the trench is substantially perpendicular to the substrate. The resultant structure is subject to a wet etching using the selected isotropic etching condition to expose the substrate. A difference in the etch rates of the upper and the lower dielectric layers makes a contact window having a wider width in a lower region than a width in a upper region. For example, the lower dielectric layer is a layer selected from the group consisting of a borophosphosilicate glass (BPSG) layer, a spin-on-glass (SOG) layer and $O_3$-TEOS layer. The upper dielectric layer is a layer selected from the group consisting of an undoped silicate glass (USG) layer, a high density plasma (HDP) oxide layer and $O_2$-TEOS layer. The lower dielectric layer may be a TEOS layer. The TEOS layer is formed by a process in which a flow rate of $O_3$ gas is decreased and a flow rate of $O_2$ gas is increased from an initial stage to an ending stage of the process. In addition, before the wet etching, a polymer with a thickness of 100–500 Å or a spacer formed of a material selected from the group consisting of polycrystalline silicon, silicon nitride and silicon oxynitride may be formed on the sidewall of the trench.

According to another aspect of the present invention, a semiconductor device is provided. The semiconductor device comprises a lower dielectric layer and an upper dielectric layer formed on a substrate, and a contact window formed through the dielectric layers. The contact window includes an upper contact window and a lower contact window extended from the upper contact window to the substrate. The upper contact window has a sidewall substantially perpendicular to the substrate. However, the lower contact window has a sloped sidewall profile such that a width of the lower contact window becomes wider and wider along the downward direction. The lower dielectric layer is a TEOS layer. The TEOS layer is formed by a process in which a flow rate of $O_3$ gas is decreased and a flow rate of $O_2$ gas is increased from an initial stage to an ending stage of the process. The semiconductor device also has a plurality of conductive patterns intervening between the upper dielectric layer and the lower dielectric layer. The plurality of conductive patterns is spaced apart from the contact window. A bottommost width of the contact window may be wider than a space between one conductive pattern and the other conductive pattern.

According to another aspect of the present invention, a semiconductor device has a first dielectric layer, a second dielectric layer and an upper dielectric layer sequentially stacked on a substrate, and has a contact window penetrating the dielectric layers. The semiconductor device also has a plurality of conductive patterns intervening between the first dielectric layer and the second dielectric layer. The plurality of conductive patterns is spaced apart from the contact window. The contact window in the first dielectric layer is wider than that in the second dielectric layer and the upper dielectric layer. A bottommost width of the contact window may be wider than a space between one conductive pattern and the other conductive pattern.

Accordingly, it is possible to maximize a contact area between a conductive material filling the contact window and the substrate, resulting in a reduction of the contact resistance. In addition, the semiconductor device may further comprise a spacer on the sidewall of the upper contact window. The spacer is formed of a material selected from the group consisting of polycrystalline silicon, silicon nitride and silicon oxynitride.

BRIEF DESCRIPTION OF THE DRAWINGS

Other features of the present invention will be more readily understood from the following detailed description of specific embodiments when read in conjunction with the accompanying drawings, in which.

DESCRIPTION OF THE PREFERRED EMBODIMENT

Now, the present invention will be described more fully hereinafter with reference to the accompanying drawings.

Figure 1:
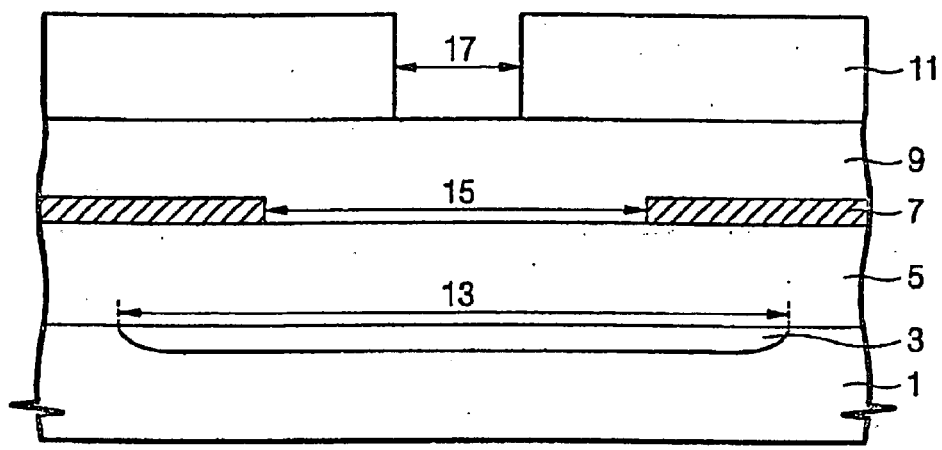
FIGS. 1 to 4 are cross-sectional views illustrating a conventional process for forming a contact window in a semiconductor device.
Figure 2:
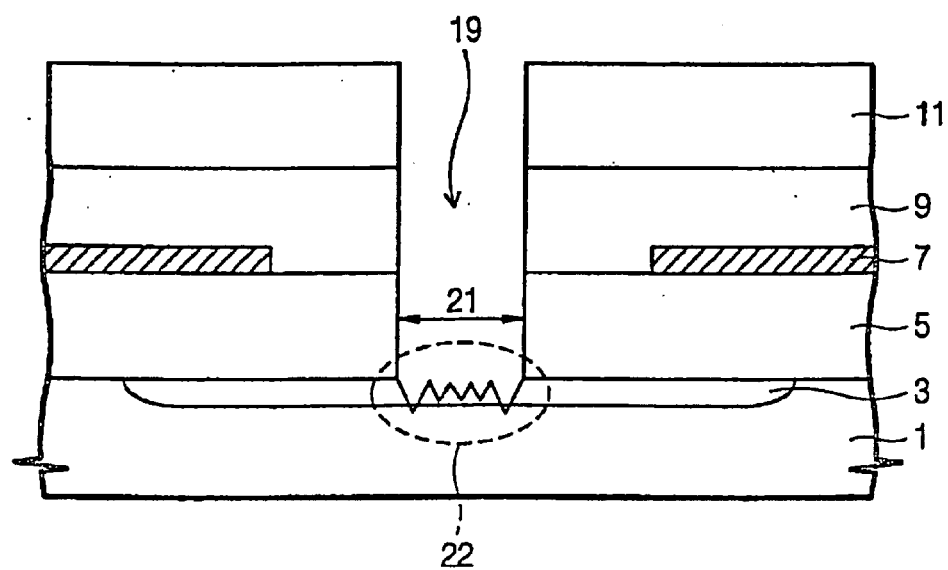
Figure 3:
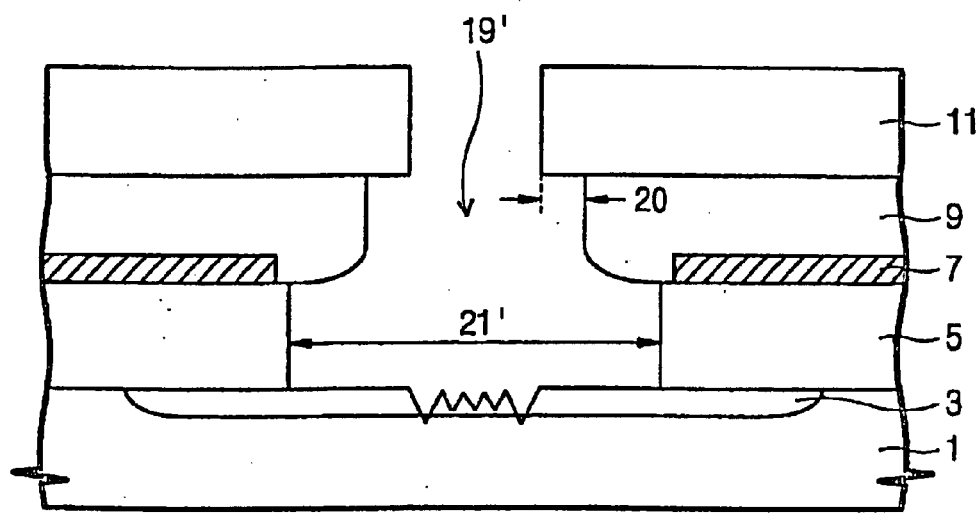
Figure 4:
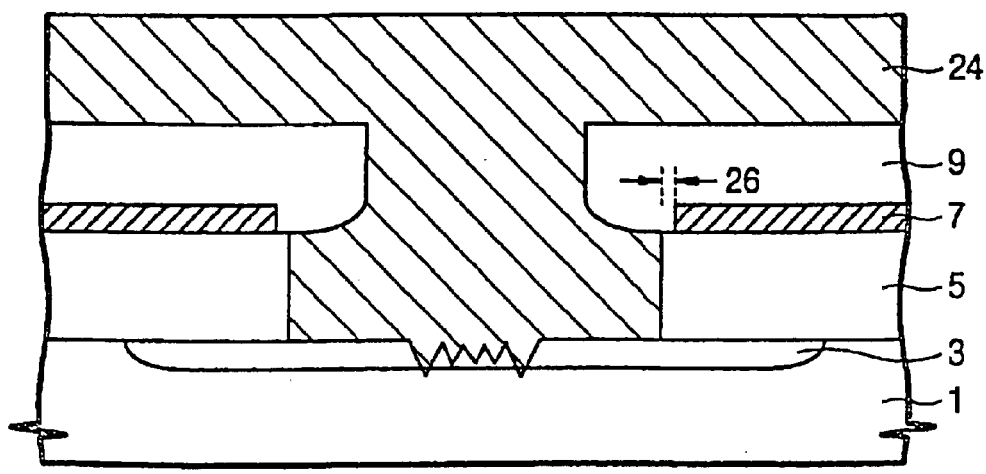
Figure 5:
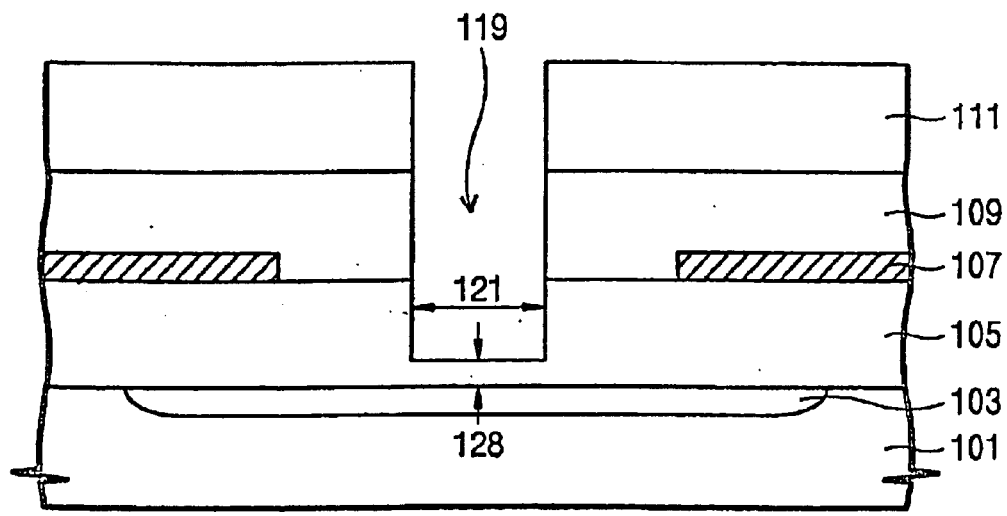
FIGS. 5 and 6 are cross-sectional views illustrating a process for forming a contact window in a semiconductor device according to a first embodiment of the present invention.
Figure 6:
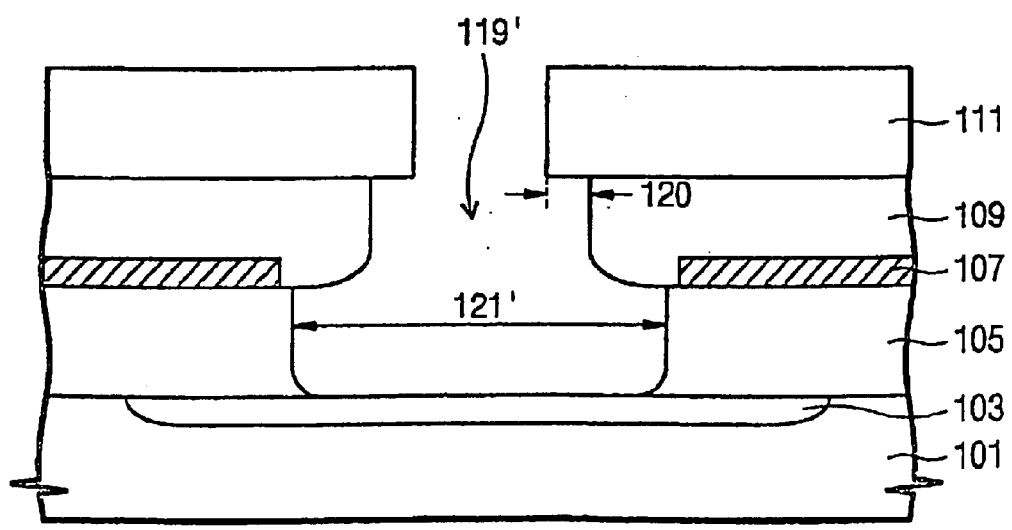

FIGS. 5 and 6 are cross-sectional views illustrating a process for forming a contact window in a semiconductor device according to a first embodiment of the present invention.

Referring to FIG. 5, a lower dielectric layer 105 is formed on a semiconductor substrate 101 having an impurity active region 103. The impurity active region 103 is formed by ion implantation. The semiconductor substrate 101 may have other types of conductive regions formed on the substrate. For example, there may be a polycrystalline silicon pattern, an aluminum wiring pattern or a tungsten plug, or other conductive regions, instead of the impurity active region 103. The lower dielectric layer 105 is a borophosphosilicate glass (BPSG) layer formed by chemical vapor deposition (CVD). A desirable thickness of the lower dielectric layer 105 is within a range of approximately 1000–6000 Å. In this embodiment, the lower dielectric layer 105 has a thickness of approximately 4000 Å. The lower dielectric layer 105 may be a spin-on-glass (SOG) layer or an $O_3$-TEOS layer. The $O_3$-TEOS layer is formed by CVD using TEOS (tetraethylorthosilicate) and $O_3$. The method for forming the $O_3$-TEOS layer is described in detail in U.S. Pat. No. 5,849,635 to Salman Akram et al.

A conductive layer can be formed to a thickness of approximately 500–3000 Å on the surface of the lower dielectric layer 105 by CVD. The conductive layer can be a doped polycrystalline silicon layer. With this embodiment, the conductive layer is preferably formed to a thickness of approximately 1500 Å. The conductive layer is patterned to form conductive patterns 107 as a local interconnection in the semiconductor device.

An upper dielectric layer 109 formed of undoped silicate glass (USG) is deposited on the resultant structure by CVD. A desirable thickness of the upper dielectric layer is within a range of approximately 1000–6000 Å. Preferably, the upper dielectric layer 109 is formed to a thickness of approximately 4000 Å. The upper dielectric layer 109 may be a high-density plasma (HDP) oxide layer or an $O_2$-TEOS layer. The $O_2$-TEOS layer is formed by CVD using TEOS (tetraethylorthosilicate) and $O_2$. The method for forming the $O_2$-TEOS layer is described in detail in the aforementioned U.S. Pat. No. 5,849,635. It is well known that wet etch rates of the BPSG layer, the SOG layer and the $O_3$-TEOS layer are faster than those of the USG layer, the HDP oxide layer and the $O_2$-TEOS layer for a hydrofluoric acid (HF) solution.

A photoresist pattern 111 having an opening is formed on the upper dielectric layer 109 using conventional techniques. The photoresist pattern 111 exposes a portion of the upper dielectric layer 109. The photoresist pattern 111 will be used as an etch mask in an etching process to be described below.

The upper dielectric layer 109 and lower dielectric layer 105 are etched by a dry etching technique using the photoresist pattern 111 as an etch mask to form a trench 119 having a width 121. Unlike the prior art, the trench does not expose the substrate 101. That is, the dry etching removes only approximately 20–95% of the total thickness of the lower dielectric layer 105, and a remainder 128 of the lower dielectric layer 105 remains under the trench 119. Therefore, no damage occurs to the substrate. It is preferable that the dry etching removes only approximately 70–95% of the total thickness of the lower dielectric layer 105. This is because the thin remainder 128 of the lower dielectric layer 105 can reduce the rounded sidewall profile of a contact window in the lower dielectric layer 105. (See FIG. 6) In a subsequent process, the rounded profile results from the wet etching process to be described below. In a conventional dry etching technique, the lateral etch rate is considerably lower than the vertical etch rate. Therefore, a sidewall of the trench 119 is perpendicular to the substrate 101. But, it is known that, with a specific dry etching condition, the sidewall of trench 119 may be angled from substrate 101 so that the width of the trench 119 decreases in a direction from an upper region of the trench 119 to a lower region of the trench 119.

Referring to FIG. 6, an isotropic HF etching solution vertically removes the remainder 128 and laterally removes the sidewall of the trench concurrently. As a result, a contact window 119' is formed to expose the impurity active region 103. Through this wet etching, while the upper dielectric layer 109 is etched to a lesser extent of a selected width 120 in the lateral direction, the lower dielectric layer 105 is etched to a greater extent in the lateral direction. Consequently, the final contact window 119' has a width 121' in a lower region that is wider than any width located in a region above it, i.e. a width in an upper region.

Though not shown in the drawings, the photoresist pattern is continuously removed and then a wiring material is formed on the upper dielectric layer 109 and inside the contact window 119'.

As described in the first embodiment, because the dry etching does not expose the substrate, damage to the impurity active region can be prevented. Therefore, it is possible to realize a reliable semiconductor device having a low contact resistance.

Figure 7:
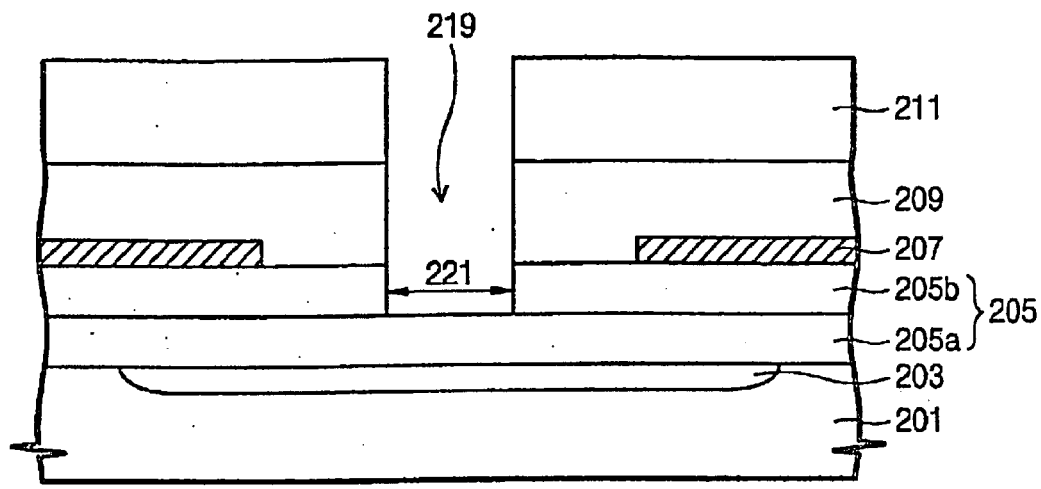
FIGS. 7 and 8 are cross-sectional views illustrating a process for forming a contact window in a semiconductor device according to a second embodiment of the present invention.
Figure 8:
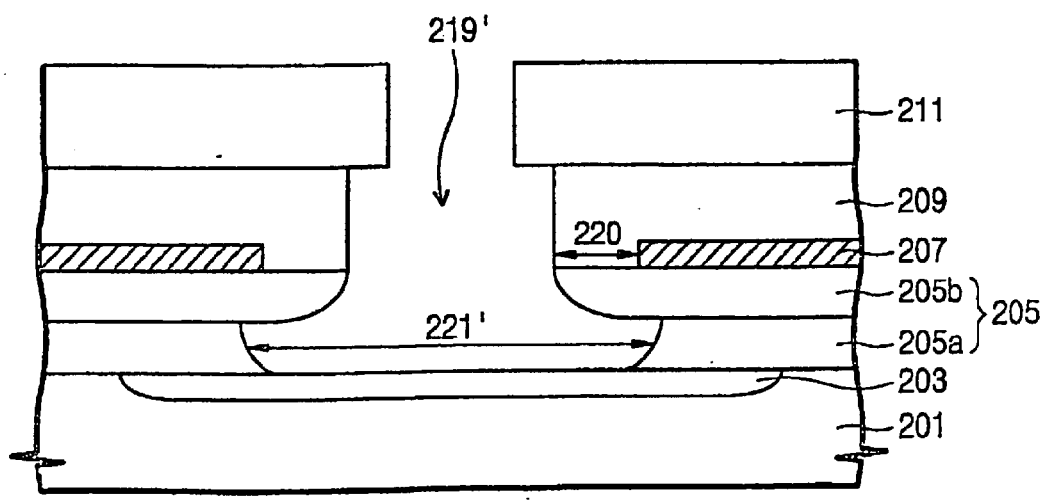

FIGS. 7 and 8 are cross sectional views illustrating a process for forming a contact window in a semiconductor device according to a second embodiment of a present invention.

Referring to FIG. 7, a first dielectric layer 205a is formed an a semiconductor substrate 201 having an impurity active region 203. The impurity active region 203 is formed by ion implantation. The first dielectric layer 205a is a BPSG layer formed by CVD. A desirable thickness of the first dielectric layer 205a is within a range of 500 Å–3000 Å. In this embodiment, the first dielectric layer 205a has a thickness of approximately 2000 Å. The first dielectric layer 205a may be an SOG layer or an $O_3$-TEOS layer.

A second dielectric layer 205b is formed on the first dielectric layer 205a. The second dielectric layer 205b is a USG layer made by CVD. A desirable thickness of the second dielectric layer is within a range of 500–3000 Å. In this embodiment, the second dielectric layer 205b has a thickness of approximately 2000 Å. The second dielectric layer 205b may be an HDP oxide layer or an $O_2$-TEOS layer. A lower dielectric layer 205 comprises the first dielectric layer 205a and the second dielectric layer 205b. Preferably, the first dielectric layer 205a comprises a material having a higher isotropic etch rate than that of the second dielectric layer 205b.

On the second dielectric layer 205b, a conductive layer is formed by CVD to a desirable thickness of approximately 500–3000 Å. An example of the conductive layer is a doped polycrystalline silicon layer. In this embodiment, the conductive layer has a thickness of approximately 1500 Å. The conductive layer is patterned to form conductive patterns 207 that are used as local interconnections in the semiconductor device.

On the conductive patterns 207 and the second dielectric layer 205b, an upper dielectric layer 209 of USG is formed. A desirable thickness of the upper dielectric layer 209 is within a range of approximately 1000–6000 Å. In this embodiment, the upper dielectric layer 209 has a thickness of approximately 4000 Å. The upper dielectric layer 209 may be an HDP oxide layer or an $O_2$-TEOS layer.

A photoresist pattern 211 is formed on the upper dielectric layer 209 using conventional techniques. The photoresist pattern 211 exposes a portion of the upper dielectric layer 209.

The upper dielectric layer 209 and second dielectric layer 205b are anisotropically etched, e.g., dry etched using the photoresist pattern 211 as an etching mask to form a trench 219 having a width 221. Unlike the prior art, this dry etching does not expose the substrate 201. That is, the first dielectric layer 205a remains under trench 219. Therefore, no damage to the semiconductor substrate 201 occurs.

In this embodiment, the bottom of the trench 219, that is, an end point of the dry etching, is located at a boundary between the first dielectric layer 205a and second dielectric layer 205b. But a portion of the first dielectric layer 205a may be removed and the bottom of the trench may be located in the first dielectric layer 205a. In this case, the dry etching removes approximately 20–95% of the total thickness of the first dielectric layer 205a. More preferably the dry etching removes approximately 70–95% of the total thickness of the first dielectric layer 205a. This is because the smaller remainder of the first dielectric layer 205a is more easily reduced to a rounded profile for a contact window in a region adjacent to the substrate. (See FIG. 8) The rounded profile results from a wet etching process to be described below.

Referring to FIG. 8, the dielectric material remaining under the trench is removed while lateral etching is simultaneously performed by an isotropic etching process using an HF solution. As a result, a contact window 219' is formed to expose the impurity active region 203. Through this wet etching, while the upper dielectric layer 209 and the second dielectric layer 205b are etched to a lesser extent in a lateral direction, the first dielectric layer 205a is etched to a greater extent in the lateral direction. Consequently, the final contact window 219' has a width 221' in a lower region greater than the width in an upper region of the window 219'.

Furthermore, even if the wet etching process is performed excessively, it can prevent the conductive patterns 207 from being exposed by contact window 219'. This is due to the presence of the second dielectric layer 205b having a lower isotropic etch rate, under the conductive pattern 207. Accordingly, it is possible to keep a predetermined distance 220 between the conductive patterns 207 and the contact window 219'.

Subsequently, though not shown in the drawings, the photoresist pattern 211 is removed and a wiring material is formed on the upper dielectric layer 209 and inside the contact window 219'.

As described in the second embodiment, because the dry etching does not expose the substrate 201, the damage to the impurity active region can be prevented. Moreover, the spacing between the contact window and the conductive patterns can be sufficiently maintained. Therefore, the wet etching can be performed to the extent necessary to maximize the lateral etching in the first dielectric layer. This means that the width 221' can be larger than the spacing between the conductive patterns 207. Thus, it is possible to maximize the exposed area of the impurity active region 203 without exposing the conductive patterns 207 and improve the contact resistance.

Figure 9:
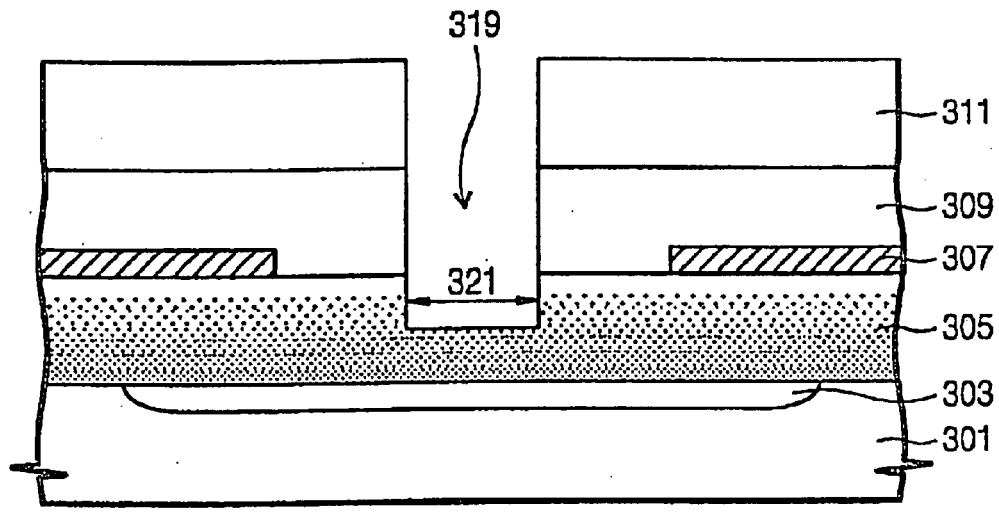
FIGS. 9 and 10 are cross-sectional views illustrating a process for forming a contact window in a semiconductor device according to a third embodiment of the present invention.
Figure 10:
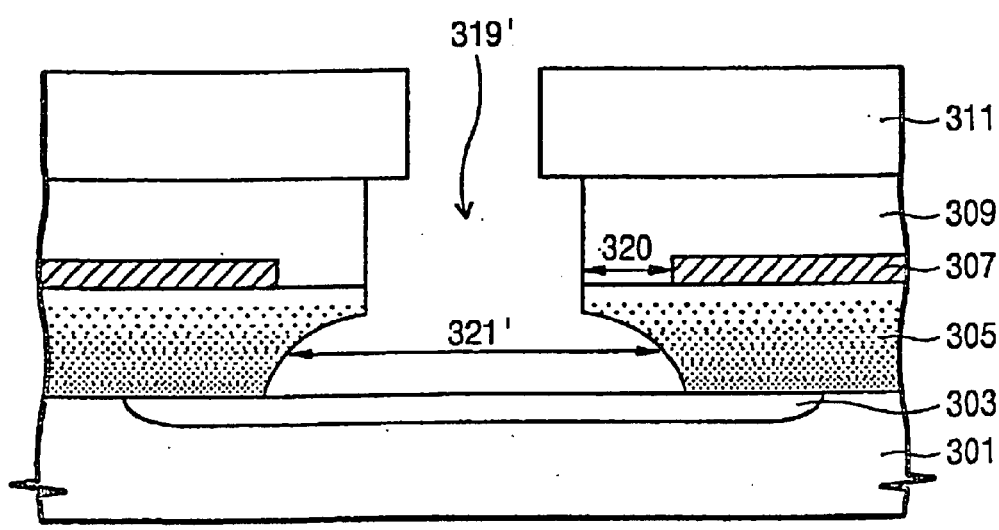

FIGS. 9 and 10 are cross sectional views illustrating a process for forming a contact window in a semiconductor device according to a third embodiment of the present invention.

Referring to FIG. 9, a lower dielectric layer 305 is formed on a semiconductor substrate 301 having an impurity active region 303. The impurity active region 303 is formed by ion implantation. The lower dielectric layer 305 is a TEOS layer formed by CVD using TEOS, $O_3$ and $O_2$. The TEOS layer is formed by a process in which a flow rate of $O_3$ gas decreases and a flow rate of $O_2$ gas increases from an initial stage to an ending stage of the process. The TEOS layer has an etch rate that gradually decreases in a direction from its bottom to the top, i.e. an etch rate that increases in a direction toward the substrate 301. A desirable thickness of the lower dielectric layer 305 is within a range of approximately 1000–6000 Å. In this embodiment, the lower dielectric layer 305 has a thickness of approximately 4000 Å. It is preferable that an upper region of the TEOS layer has a thickness of approximately 500–1000 Å and has the same etch rate as that of an upper dielectric layer 309 to be formed later. A method for forming the TEOS layer is also described in detail in U.S. Pat. No. 5,849,635 issued to Salman Akram et al.

On the lower dielectric layer 305, conductive patterns 307 can be formed in the same manner as described in the first and second embodiments of the present invention with reference to FIGS. 5 to 8.

On the resultant structure having the conductive patterns 307, an upper dielectric layer 309 of USG is formed using CVD. A desirable thickness of the upper dielectric layer is within a range of 1000–6000 Å. In this embodiment, the upper dielectric layer 309 has a thickness of approximately 4000 Å. The upper dielectric layer 309 may be an HDP oxide layer or an $O_2$-TEOS layer.

A photoresist pattern 311 is formed on the upper dielectric layer 309 by a well-known photolithographic and etching processes. The photoresist pattern 311 exposes a portion of the upper dielectric layer 309.

The upper dielectric layer 309 and lower dielectric layer 305 are etched by a dry etching technique using the photoresist pattern 311 as a etching mask to form a trench 319 having a width 321. Unlike the prior art, this dry etching does not expose the substrate 301. That is, the dry etching removes approximately 20–95% of the total thickness of the lower dielectric layer 305. It is preferable that the dry etching removes approximately 70–95% of the total thickness of the lower dielectric layer 305.

Referring to FIG. 10, an isotropic etching process using an HF solution forms a contact window 319' exposing the impurity active region 303. Through this wet etching, the upper dielectric layer 309 is etched to a lesser extent in a lateral direction while, the lower dielectric layer 305 is etched to a greater extent in the lateral direction resulting in a sidewall profile having a negative slope. Consequently, the final contact window 319' has a width 321' in a lower region greater than a width in an upper region. In other words, the width of contact window 319' increases as one moves toward the substrate.

Subsequently, though not shown in the drawings, the photoresist pattern 311 is removed and a wiring material is formed on the upper dielectric layer 309 and inside the contact window 319'.

As described in the third embodiment, because the dry etching does not expose the substrate 301, the damage to the impurity active region 303 is substantially prevented. In addition, the distance (320 of FIG. 10) between the contact window and the conductive patterns can be maintained with sufficient thickness. This is because the etch rate of the lower dielectric layer 305 gradually decreases in the direction from bottom to top, and the etch rate in the upper region of the lower dielectric layer 305 is relatively low. Moreover, a width of the bottommost region of the contact window 319' can be made larger than the spacing between the conductive patterns 307. This is because the etch rate in the bottommost region of the lower dielectric layer can be set relatively high.

Figure 11:
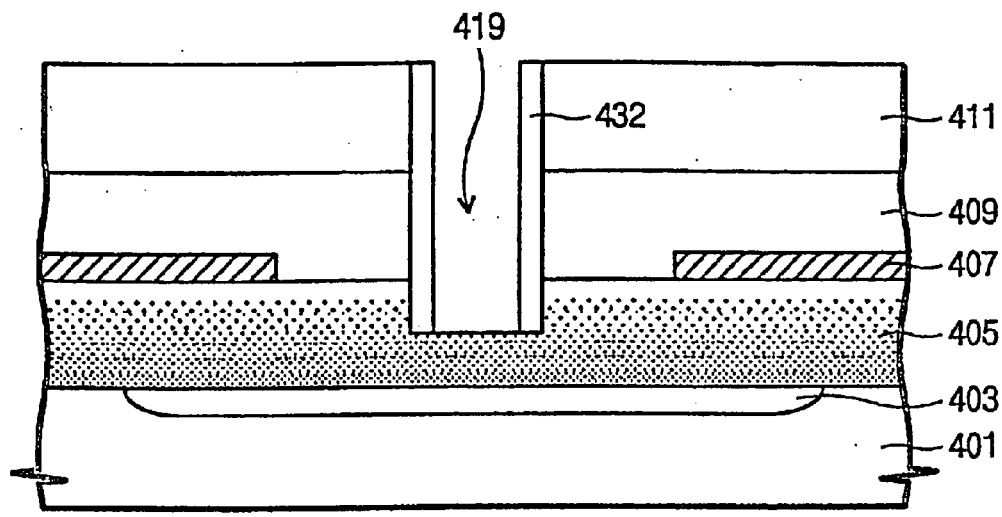
FIGS. 11 to 14 are cross-sectional views illustrating a process for forming a contact window in a semiconductor device according to a fourth embodiment of the present invention.
Figure 12:
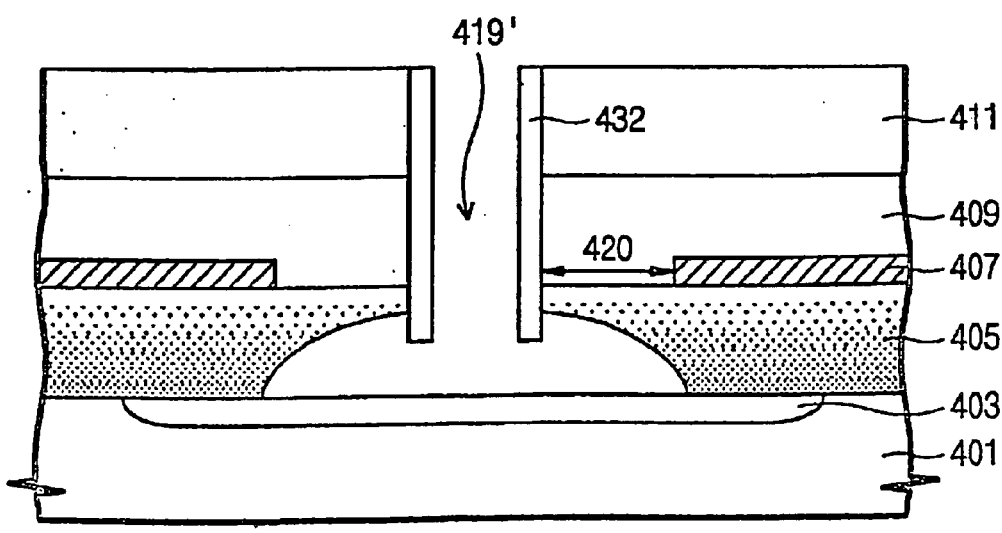

FIGS. 11 and 12 are cross sectional views illustrating a process for forming a contact window in a semiconductor device according to a fourth embodiment of the present invention.

Referring to FIG. 11, a lower dielectric layer 405 is formed on a semiconductor substrate 401 having an impurity active region 403. The impurity active region 403 is formed by ion implantation. The lower dielectric layer 405 is a TEOS layer as described in the third embodiment of the present invention. Also, conductive patterns 407, an upper dielectric layer 409, and a photoresist pattern 411 are formed by the same method as the third embodiment of the present invention.

The upper dielectric layer 409 and the lower dielectric layer 405 are etched by a dry etching technique using the photoresist pattern 411 as an etching mask to form a trench 419. Unlike the prior art, this dry etching does not expose the substrate 401. That is, the remainder of the lower dielectric layer 405 exists under the trench 419 with a thickness of approximately 500–3000 Å. In this embodiment, the remainder has a thickness of approximately 2000 Å. Meanwhile, the dry etching is controlled in order to form a polymer layer 432 on the sidewall of the photoresist pattern 411 and the trench 419. The polymer layer 432 should be thick enough to suppress a lateral anisotropic etching to be performed in a subsequent process. In this embodiment, it is preferable that the polymer layer 432 has a thickness of 100–500 Å.

It is well known that carbon-oxygen gas enhances generation of a polymer on a sidewall of an etched region. The carbon-oxygen gas enhances the formation of free carbon species that react with other species such as nitrogen, fluorine or boron, thereby forming polymer. This polymer is deposited on the sidewalls of the etched region. Therefore, in a dry etching process, increasing the flow rate of the carbon-oxygen gas can enhance generation of the polymer. Suitable carbon-oxygen gases include for example, CO, HCOOH, or HCHO, of which CO is preferred. This method to enhance the formation of polymers has been widely used in industry to deposit the polymers on the sidewalls of etched features during dry etchings. An example of this is described in great detail in U.S. Pat. No. 5,843,847 issued to Bryan Pu et al.

Referring to FIG. 12, an isotropic wet etching process is performed to remove the remainder of the lower dielectric layer 405 and to perform lateral etching. As a result, a contact window 419' is formed to expose the impurity active region 403. In this wet etching, the polymer 432 suppresses the lateral etching on the sidewall of the trench 419. Consequently, the lateral etching of the sidewall of trench 419 can be minimized. Thus, it is possible to keep a predetermined distance 420 between the conductive patterns 407 and the contact window 419'. The wet etchant used is a mixture of a deionic (DI) water, $NH_4F$ and HF. A volume percentage of the HF in the mixture is approximately 0.1–0.4%. For example, in this embodiment, the mixture comprises approximately 82.6 Vol % DI water, 17.1 Vol % $NH_4F$, 0.3 Vol % HF.

Though not shown in the drawings, the photoresist pattern and the polymer are removed, and a wiring material is formed on the upper dielectric layer 409 and inside the contact window 419'.

Figure 13:
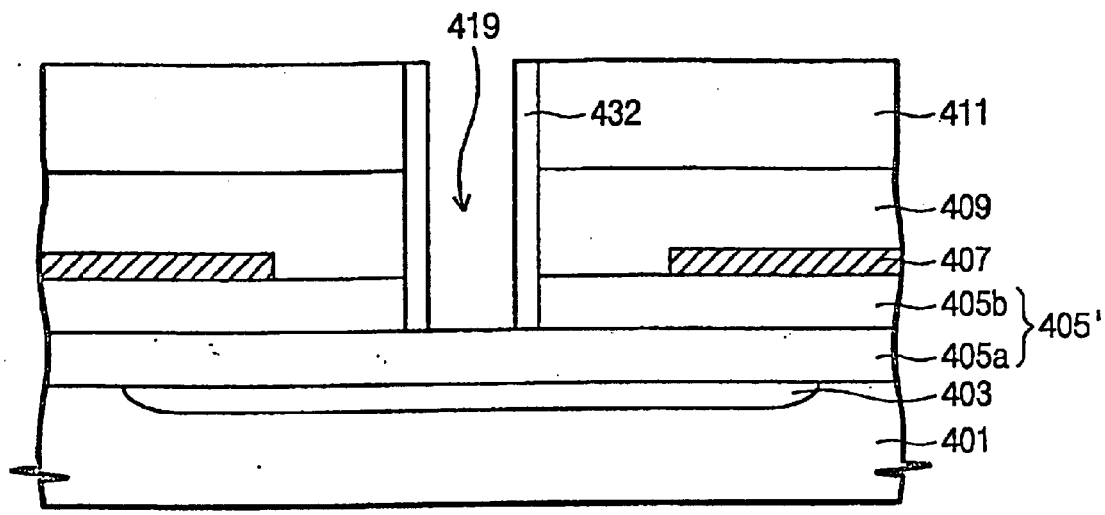
Figure 14:
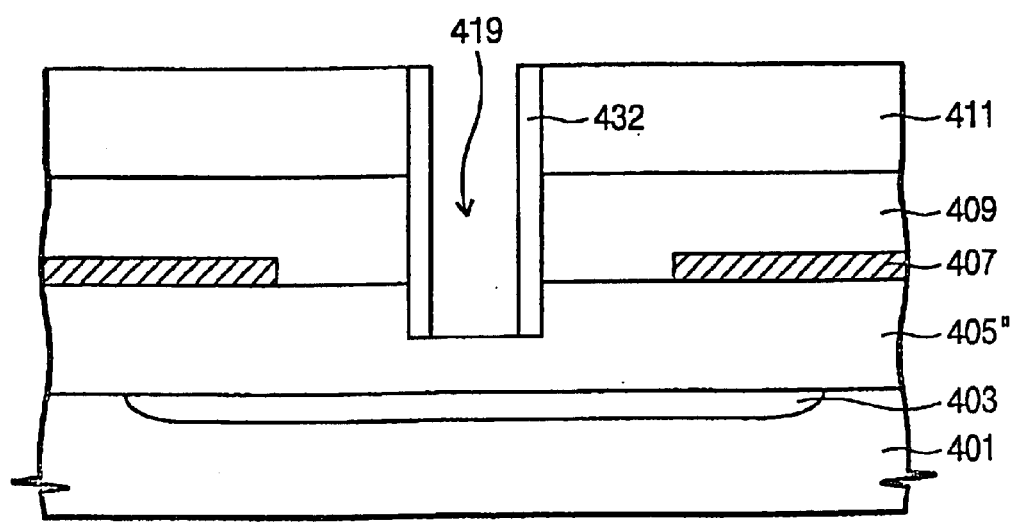

FIGS. 13 and 14 are cross sectional views illustrating slight variations of the fourth embodiment. The variations are the same as the fourth embodiment except for the differences described below.

Referring FIG. 13, a lower dielectric layer 405' comprises a first dielectric layer 405a and a second dielectric layer 405b as described in the second embodiment. That is, the first dielectric layer 405a comprises a BPSG layer, an SOG layer or an $O_3$-TEOS layer. The second dielectric layer 405b is formed on the first dielectric layer 405a. The second dielectric layer 205b comprises a USG layer, an HDP layer or an $O_2$-TEOS layer. In FIG. 13, the bottom of the trench 419, an end point of the dry etching, is located at a boundary between the first dielectric layer 405a and the second dielectric layer 405b. However, a portion of the first dielectric layer 405a may be removed and the bottom of the trench may be located in the first dielectric layer.

Referring to FIG. 14, a lower dielectric layer 405" comprises a BPSG layer, an SOG layer or an $O_3$-TEOS layer as described in the first embodiment.

As described in the fourth embodiment and its variations, because the dry etching does not expose the substrate, damage to the impurity active region 403 can be prevented. Moreover, the spacing between the contact window and the conductive patterns 407 can be maintained sufficiently thick, since the polymer suppresses the lateral etching on the sidewall of the trench 419.

Figure 15:
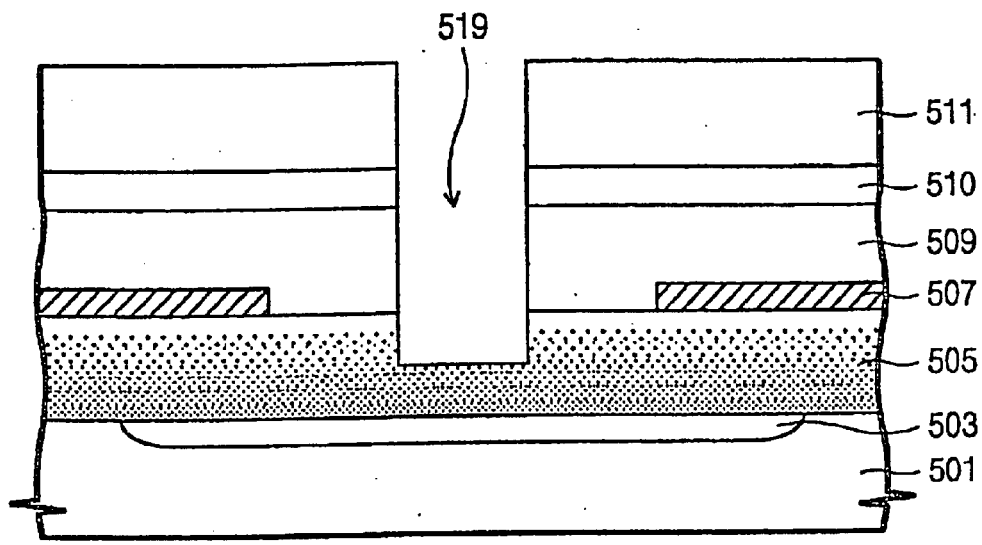
FIGS. 15 to 19 are cross-sectional views illustrating a process for forming a contact window in a semiconductor device according to a fifth embodiment of the present invention.
Figure 16:
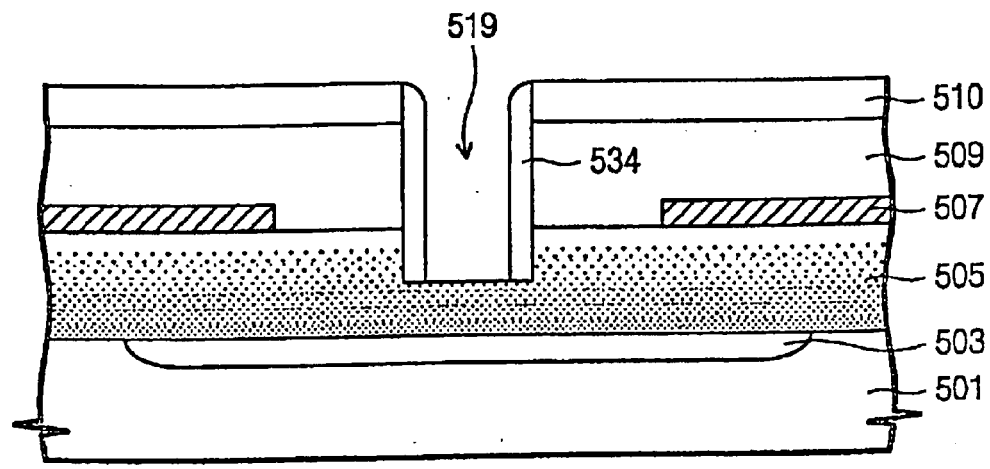
Figure 17:
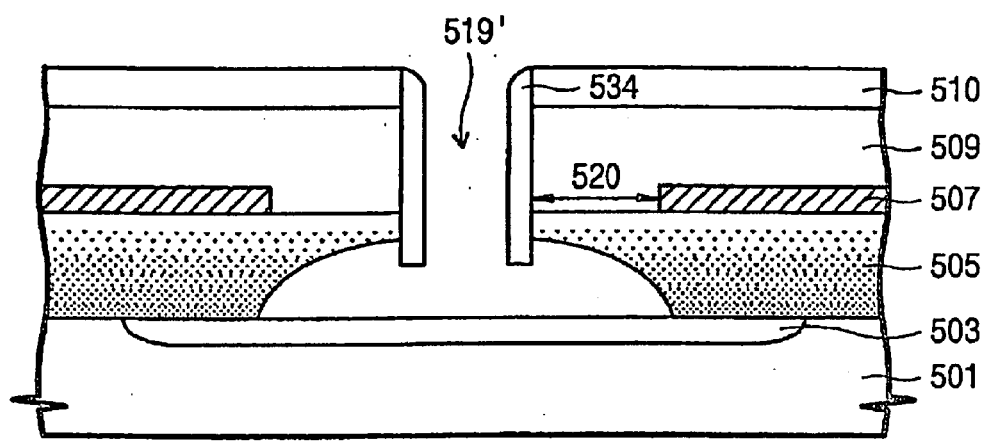

FIGS. 15 to 17 are cross-sectional views illustrating a process for forming a contact window in a semiconductor device according to a fifth embodiment of the present invention.

Referring to FIG. 15, a lower dielectric layer 505, conductive patterns 507, and an upper dielectric layer 509 are formed on a semiconductor substrate 501 having an impurity active region 503 using the same manner as the third embodiment. On the upper dielectric layer 509, a capping layer 510 is formed of polycrystalline silicon, silicon nitride or silicon oxynitride. In this embodiment, the capping layer 510 is formed of silicon nitride by CVD.

A photoresist pattern 511 is formed on the capping layer 510. The photoresist pattern 511 exposes a portion of the capping layer 510.

The capping layer 510, the upper dielectric layer 509 and the lower dielectric layer 505 are etched by a dry etching process using the photoresist pattern 511 as an etching mask to form a trench 519. Unlike the prior art, this dry etching does not expose the substrate 501. That is, a remainder of the lower dielectric layer exists under the trench 519 with a thickness of 500–3000 Å. In this embodiment, the remainder has a thickness of approximately 2000 Å.

Referring to FIG. 16, the photoresist pattern 511 is removed, then a spacer 534 is formed on the sidewall of the trench 519 and the capping layer 510. The spacer 534 can be formed of polycrystalline silicon. That is, once the resultant structure in which the photoresist pattern 511 is removed, a conformal polycrystalline silicon layer is formed. Then, the conformal polycrystalline silicon layer is etched anisotropically to form the spacer 534 on the sidewall of the trench 519 and the capping layer 510. The spacer 534 may be formed of silicon nitride or silicon oxynitride. In this case, the spacer 534 formed of silicon nitride or silicon oxynitride may play a role of one of dielectric materials between conductive patterns 507 and a wiring layer to be formed later.

Referring to FIG. 17, an isotropic etching with a wet etchant is performed to remove the remainder of the lower dielectric layer and to perform lateral etching. As a result, a contact window 519' is formed to expose the impurity active region 503. In this wet etching, the spacer 534 and the capping layer 510 suppress the wet etching on the sidewall of the trench and an upper surface of the upper dielectric layer to minimize the amount of lateral etching on the sidewall. The wet etchant is a dilute HF solution.

Though not shown in the drawings, a wiring material is formed on the upper dielectric layer 509 and inside the contact window 519'.

Figure 18:
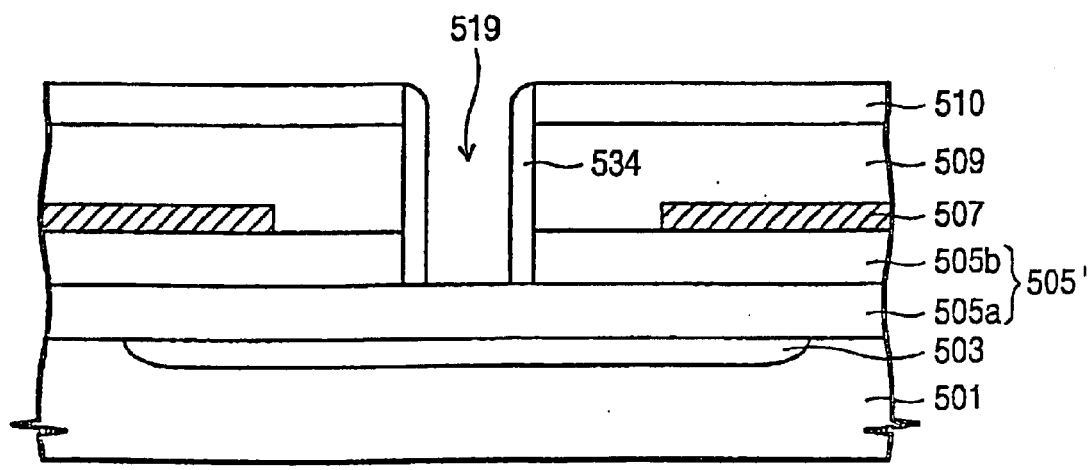
Figure 19:
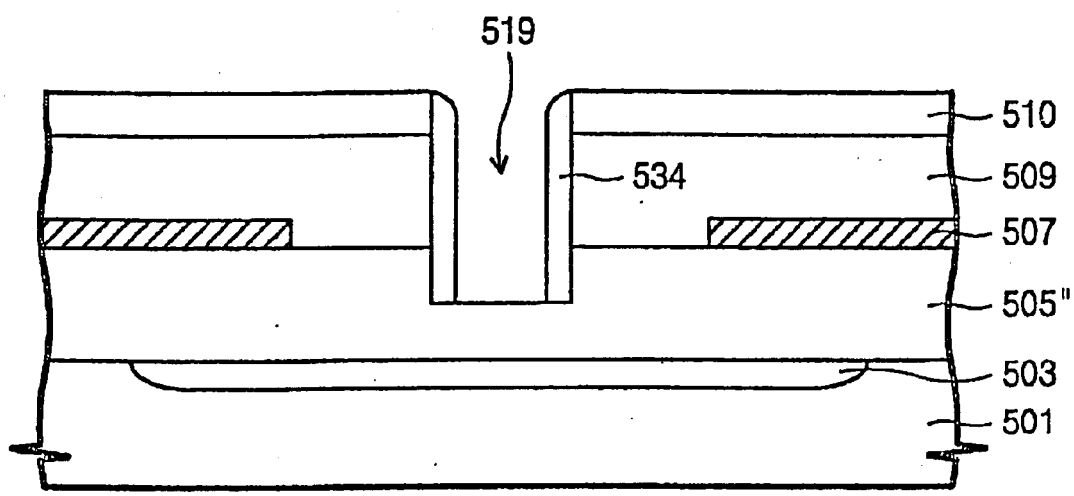

FIGS. 18 and 19 are cross sectional views illustrating a sixth and seventh embodiment of the present invention. These embodiments are the same as the fifth embodiment except for the slight differences described below.

Referring to FIG. 18, a lower dielectric layer 505' comprises a first dielectric layer 505a and a second dielectric layer 505b, as described in the second embodiment. That is, the first dielectric layer 505a is one of a BPSG layer, an SOG layer and an $O_3$-TEOS layer. The second dielectric layer 505b is formed on the first dielectric layer 505a. The second dielectric layer 505b is one of a USG layer, an HDP layer and an $O_2$-TEOS layer. In FIG. 18, a bottom of the trench 519, e.g., an end point of the dry etching, is located at a boundary between the first dielectric layer 505a and second dielectric layer 505b. A portion of the first dielectric layer 505a may be removed and the bottom of the trench may be located in the first dielectric layer.

Referring FIG. 19, a lower dielectric layer 505" is one of a BPSG layer, an SOG layer and an O₃-TEOS layer as described in the first embodiment.

As described in the fifth embodiment and its variations, because the dry etching does not expose the substrate, damage to the impurity active region can be prevented. Moreover, the space between the contact window and the conductive patterns can be sufficiently maintained, because the spacer 534 suppresses the lateral etching on the sidewall of the trench 519.

Again referring to FIG. 8, a description of a structure of a contact window of a semiconductor device fabricated by the method of the second embodiment of the present invention is presented.

A semiconductor substrate has an impurity active region 203. A lower dielectric layer 205 and an upper dielectric layer 209 are stacked on the semiconductor substrate 201 having the impurity active region 203. The lower dielectric layer 205 comprises a first dielectric layer 205a and a second dielectric layer 205b. The first dielectric layer 205a is a BPSG layer, an SOG layer or an O₃-TEOS layer. The second dielectric layer 205b and the upper dielectric layer 209 is a USG layer, an HDP layer or an O₂-TEOS layer. The second dielectric layer 205b and the upper dielectric layer 209 have a lower wet etch rate than etch rates of the first dielectric layer 205a for an HF solution.

The impurity active region 203 is exposed to a contact window 219' which passes through the lower dielectric layer 205 and the upper dielectric layer 209.

The contact window 219' comprises an upper contact window region and a lower contact window region. The upper contact window region passes through the upper dielectric layer 209 and second dielectric layer 205b. The lower contact window region passes through the first dielectric layer 205a. As shown in the figure, a width 221' of the lower contact window region is wider than a width of the upper contact window region. Meanwhile, conductive patterns 207 may intervene between the upper dielectric layer 209 and the lower dielectric layer 205. The conductive patterns 207 are spaced apart from the contact window 219'. That is, the upper contact window region passes through a region between the neighboring conductive patterns 207, but does not expose the conductive patterns 207. Although the width of the upper contact window region is narrower than the space between the conductive patterns 207, an exposed surface of the impurity active region 203 can be wider than the space between the conductive patterns 207. That is, a width of a bottommost region of the contact window can be controlled to be larger than the space between the conductive patterns 207.

Moreover, although the wet etching is excessively performed, the second dielectric layer 205b is prevented from exposing of the conductive patterns 207 because of the relatively low wet etch rate of the second dielectric layer 205b. Therefore, it is possible to obtain a reliable semiconductor device having high density.

Again referring to FIG. 10, a description of a structure of a contact window of a semiconductor device fabricated by the method of the third embodiment of the present invention is presented.

In FIG. 10, a dielectric layer comprises a lower dielectric 305 and an upper dielectric layer 309. A contact window 319' passes through the dielectric layer and has a wider width 321' of a lower region of the contact window 319' than a width of an upper region of the contact window 319'. The width 321' of a lower region of the contact window 319' becomes wider as one approaches substrate 301. The lower dielectric layer 305 is a TEOS layer, which has a wet etch rate for an HF solution that gradually decreases in a direction from the bottom to the top of the layer 305. The upper dielectric layer 309 has a thickness of approximately 4000 Å. It is more desirable that an upper region of the TEOS layer with 500–1000 Å thickness has the same etch rate as the etch rate of the upper dielectric layer 309. The upper dielectric layer 309 is an USG layer, an HDP layer or an O₂-TEOS layer. The upper dielectric layer 309 has a thickness of 4000 Å.

The upper dielectric layer 309 may be an HDP layer or an O₂-TEOS layer.

A method for forming the TEOS layer having a changing etch rate is described in detail in U.S. Pat. No. 5,849,635 issued to Salman Akram et al. The desirable thickness of the lower dielectric layer 305 is preferably within a range of 1000–6000 Å. In this embodiment, the lower dielectric layer has a thickness of approximately 4000 Å. Though not depicted in the drawings, a wiring material in the contact window 307 contacts the substrate 301.

Conductive patterns 307 intervene between the upper dielectric layer 309 and the lower dielectric layer 305. The conductive patterns 307 can be made of polycrystalline silicon. One conductive pattern is isolated from the other conductive pattern with a predetermined distance. A dielectric region with a selected width 320 intervenes between the contact window 319' and the conductive patterns 307.

A width of a bottommost region of the contact window can be made larger than the spacing between the conductive patterns 307. The contact window described above can increase the contact area and thereby decrease the contact resistance between the wiring layer and the substrate.

Again referring to FIG. 17, a description of a structure of a contact window of a semiconductor device fabricated by the method of the fifth embodiment of the present invention is presented.

In FIG. 17, a dielectric layer comprises a lower dielectric 505 and an upper dielectric layer 509. A contact window 519' passes through the dielectric layer and a capping layer 510 formed on the upper dielectric layer 509. The contact window 519' has a width 521' of a lower region of the contact window 519' greater than the width of an upper region of the contact window 519'. The lower dielectric layer 505 and the upper dielectric layer 509 are formed using the same layer as described in the third embodiment. The lower dielectric layer 505 and the upper dielectric layer 509 may be formed using the same layer as described in the first embodiment or the second embodiment. The capping layer 510 has a thickness of approximately 1000 Å and is made of polycrystalline silicon, silicon nitride or silicon oxynitride.

A spacer 534 is formed on the sidewall of an upper region of the contact window 519'. The spacer 534 has a thickness of 300 Å and is formed of polycrystalline silicon, silicon nitride or silicon oxynitride. Though not shown in the drawings, a wiring material in the contact window 507 having the spacer contacts the substrate 501.

Conductive patterns 507 are placed between the upper dielectric layer 509 and the lower dielectric layer 505. The conductive patterns 507 can be made of polycrystalline silicon. One of the conductive patterns 509 is spaced apart from the other by a predetermined distance. A dielectric material with a selected width intervenes between the contact window 519' and the conductive patterns 507.

The spacer 534 insures electrical isolation between the conductive patterns 507 and the wiring layer.

In the fabrication method of the present invention, because the dry etching does not expose the substrate 501, damage to the impurity active region can be prevented. An increased contact area can be obtained by controlling the etch rate of the lower dielectric layer 505a. Moreover, a high quality isolation characteristic between the wiring layer and the conductive patterns 507 are obtained by using the polymer and the spacer 534.

In the drawings and specification, there have been disclosed typical preferred embodiments of the invention and, although specific terms are employed, they are used in a generic and descriptive sense only and not for purpose of limitation, the scope of the invention being set forth in the following claims.

What is claimed is:

1. A semiconductor device comprising:
    a dielectric layer on a semiconductor substrate, the dielectric layer comprising a lower dielectric layer and an upper dielectric layer;
    a contact window passing through the dielectric layer;
    an upper region of the contact window having a sidewall substantially perpendicular to the substrate;
    a lower region of the contact window having a width that increases in a direction toward the substrate; and
    a plurality of conductive patterns disposed between the lower dielectric layer and the upper dielectric layer, wherein the conductive patterns are spaced apart from the contact window, wherein one of the plutality of conductive patterns is spaced apart from another one of the plurality of conductive patterns by a selected distance, and a bottommost width of the contact window is wider than the selected distance.

2. A semiconductor device comprising:
    a dielectric layer on a scmiconductor substrate;
    a contact window passing through the dielectric layer;
    an upper region of the contact window having a sidewall substantially perpendicular to the substrate;
    a lower region of the contact window having a wider width than that of the upper region of tbe contact window;
    a spacer on the sidewall; and
    a plurality of conductive patterns in the dielectric layer, wherein the plurality of conductive patterns is spaced apart from the contact window.

3. The semiconductor device of claim 2, wherein one of the plurality of conductive patterns is spaced apart from another one of the plurality of conductive patterns with a selected distance, and a bottommost width of the contact window is wider than the selected distance.

4. The semiconductor device of claim 2 further comprises a capping layer on the dielectric layer.

5. The semiconductor device of claim 4, wherein the capping layer is made from a material selected of the group consisting of polycrystalline silicon, silicon nitride and silicon oxynitride.

6. The semiconductor device of claim 2, wherein the spacer is made of a material selected from the group consisting of polycrystalline silicon, silicon nitride and silicon oxynitride.

7. A semiconductor device comprising:
    an interlayer dielectric layer on a semiconductor substrate, wherein the interlayer dielectric layer comprises a first dielectric layer, a second dielectric layer and an upper dielectric layer;
    a contact window passing through the interlayer dielectric layer, wherein a lower region of the contact window has a wider width than that of an upper region of the contact window; and
    a plurality of conductive patterns intervening between the second dielectric layer and the upper dielectric layer, wherein the conductive patterns are spaced apart from the contact window, wherein one of the plurality of conductive patterns is spaced apart from another one of the plurality of conductive patterns with a selected distance, and a bottommost width of the contact window is wider than the distance.

8. The semiconductor device of claim 7, wherein a width of the contact window in the upper dielectric layer is substantially the same as a width of the contact window in the second dielectric layer.

* * * * *

UNITED STATES PATENT AND TRADEMARK OFFICE
CERTIFICATE OF CORRECTION

PATENT NO. : 6,919,640 B2
APPLICATION NO. : 10/823485
DATED : July 19, 2005
INVENTOR(S) : Jeon et al.

It is certified that error appears in the above-identified patent and that said Letters Patent is hereby corrected as shown below:

At Column 1, Line 7, please replace "Jan. 13, 2003" with --January 13, 2003--

At Column 1, Line 9, please replace "application Ser. No." with --Application Ser. No.--

At Column 1, Line 9, please replace "Sep. 7, 2001" with --September 7, 2001--

At Column 3, Line 15, please replace "a upper region" with --an upper region--

At Column 6, Line 9, please replace "formed an" with --formed on--

At Column 8, Line 12, please replace "a etching" with --an etching--

At Column 13, Line 29, please replace "plutality" with --plurality--

Signed and Sealed this

Twenty-first Day of November, 2006

JON W. DUDAS
*Director of the United States Patent and Trademark Office*